United States Patent [19]

Kwasnick et al.

[11] Patent Number: 5,389,775
[45] Date of Patent: Feb. 14, 1995

[54] IMAGER ASSEMBLY WITH MULTIPLE COMMON ELECTRODE CONTACTS

[75] Inventors: Robert F. Kwasnick, Schenectady, N.Y.; Scott W. Petrick, Pewaukee; Lawrence R. Skrenes, Hartland, both of Wis.

[73] Assignee: General Electric Company, Schenectady, N.Y.

[21] Appl. No.: 161,030

[22] Filed: Dec. 3, 1993

[51] Int. Cl.6 .............................................. H01L 27/14
[52] U.S. Cl. .................................. 250/208.1; 257/448
[58] Field of Search ...................... 250/208.1; 257/443, 257/448, 459

[56] References Cited

U.S. PATENT DOCUMENTS

| | | | |
|---|---|---|---|
| 4,482,807 | 11/1984 | Blackburn et al. | 257/448 |
| 4,594,471 | 6/1986 | Yamazaki | 257/448 |
| 4,651,001 | 3/1987 | Harada et al. | 257/443 |
| 4,727,407 | 2/1988 | Nobue et al. | 257/448 |
| 4,775,880 | 10/1988 | Suzuki et al. | 257/459 |
| 5,216,274 | 6/1993 | Mihara | 257/459 |
| 5,303,074 | 4/1994 | Salisbury | 359/59 |

Primary Examiner—David C. Nelms
Assistant Examiner—Stephone B. Allen
Attorney, Agent, or Firm—Donald S. Ingraham; Marvin Snyder

[57] ABSTRACT

An x-y-addressed imager assembly includes a common electrode having more than two electrical contact points disposed at selected intervals along each edge of the common electrode that corresponds to a lateral boundary of the imager assembly. The selected intervals are typically about equal in length and not greater than about 12% of the length of the edge of the common electrode. The multiple electrical contacts along the common electrode provide low impedance and low magnetic loop area for signals passing along the common electrode to readout and drive circuits.

13 Claims, 3 Drawing Sheets

IMAGER ASSEMBLY WITH MULTIPLE COMMON ELECTRODE CONTACTS

RELATED APPLICATIONS

This application is related to the application entitled "Method of Locating Common Electrode Shorts In An Imager Assembly", Ser. No. 08/161,037, Ser. No. 08/161,037, filed concurrently herewith, which is assigned to the assignee of the present invention and which is incorporated herein by reference.

BACKGROUND OF THE INVENTION

This invention relates generally to radiation imager arrays and in particular relates to a common electrode structure in an x-y addressed imager array that is configured to have reduced common electrode impedance and low magnetic loop area for returning signal currents and further configured for ready determination of the location of short circuits between address lines and the common electrode.

Complex electronic devices are commonly formed on substrates in fabrication processes involving the deposition and patterning of multiple layers of conductive, semiconductive, and dielectric materials so as to form multiple individual electronic components. For example, large area imager arrays (e.g., having an area of about 25 cm$^2$ or more) are commonly fabricated on a wafer and contain photodiodes and circuitry for reading the output of the photodiodes, such as address lines and switching components (e.g., thin film transistors (TFTs)). In such an array a common electrode layer extends over the top of almost the entire pixel array, with the off-the-wafer contacts for the common electrode being disposed at the four corners of the common electrode.

Such an arrangement for the common electrode, with off-the wafer contacts disposed at the four corners, necessitates that all readout and drive circuitry for the various address lines (an imager with an area of about 25 cm$^2$ may have one thousand or more address lines) be coupled to one of the four contact points, an arrangement that can result in a high impedance common electrode and large magnetic loop area for low-level returning signal currents. This arrangement can result in significantly higher susceptibility of the detector and readout electronics to radiated electric and magnetic fields generated by external circuits (that is, EMI). High common electrode impedance can further lead to increased susceptibility of the detector and readout electronics to conducted interference, particularly when defects within the detector array are scanned (or read out).

Further, during fabrication defects in such imager arrays can result from, among other causes, impurities in materials deposited to form the various components. One example of such an impurity-based defect is a short circuit between the common electrode and an underlying address line in the pixel array. Such short circuits disrupt the desired electrical connections between devices in the array and seriously degrade the performance of one or more of the individual electronic components on the wafer, often to the point of making an entire wafer unusable.

It is often difficult to locate a short circuit to the common electrode as the electrode extends over substantially the entire upper surface of the array, thus covering the entire length of each address line, including the address line to which it is shorted. Traditionally, a detailed visual inspection of the array has been required to attempt to locate the short circuit, a process that is time consuming and not always successful in locating the site of the short circuit. Procedures and imager structures that enable one to lessen the time to find the defect hasten the repair effort and thus reduce the overall cost of fabricating the array and improve the manufacturing yield of the array fabrication process.

One object of this invention is to provide an imager assembly that has a structure with multiple electrical contacts to the common electrode disposed along the sides of the imager at points in addition to the corners of the imagers to facilitate the localization of a short circuit between the common electrode and an address line.

A further object of this invention is to provide an imager assembly that has a structure with multiple electrical contacts to the common electrode disposed along the sides of the imager at points in addition to the corners of the imagers to provide low-impedance and small magnetic loop area return path common electrode contact points for readout circuitry for the data lines of the array.

SUMMARY OF THE INVENTION

An x-y-addressed imager assembly in accordance with this invention comprises a photosensor array including a common electrode having more than two electrical contact points disposed at selected intervals along each edge of the common electrode that corresponds to a lateral boundary of the imager assembly. The electrical contacts are typically disposed at equal intervals along the length of the common electrode edge and comprise a protrusion of conductive material extending beyond the lateral limits of the active region of the photosensor array.

The multiple electrical contact points along the edge of the array configure the common electrode for multiple low-impedance, small magnetic loop area return path contacts with readout circuits coupled to data lines extending from the array and for use with a method for locating common electrode shorts in an x-y-addressed imager assembly having a short circuit between an address line and an overlying common electrode. The method of locating the shorts includes the steps of applying a test voltage to the address line shored to the common electrode, measuring current at each of a plurality of common electrode contact points disposed at selected intervals along selected edges of the common electrode, and processing the respective measured currents in accordance with a selected relationship to localize a short circuit location along the length of the shorted address line.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
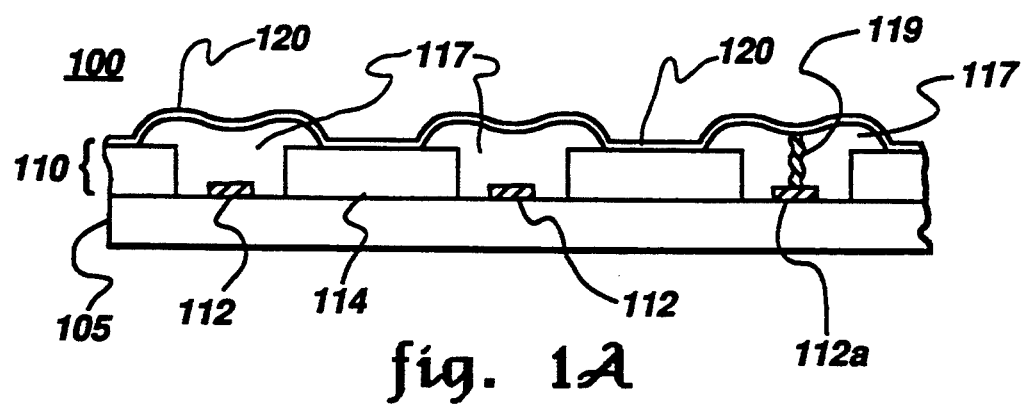
FIG. 1(A) is a cross-sectional view of a portion of an imager assembly having an undesired conductive path between the common electrode and an address line in the array.

A radiation imager assembly 100, such as an x-ray imager, typically comprises a substrate 105 on which a photosensor array 110 is disposed, as is illustrated in FIG. 1(A). Photosensor array 110 typically comprises a plurality of electronic components, such as address lines 112, photodiodes 114, and switching devices, e.g., thin film transistors (TFTs) (not shown).

Figure 1B:
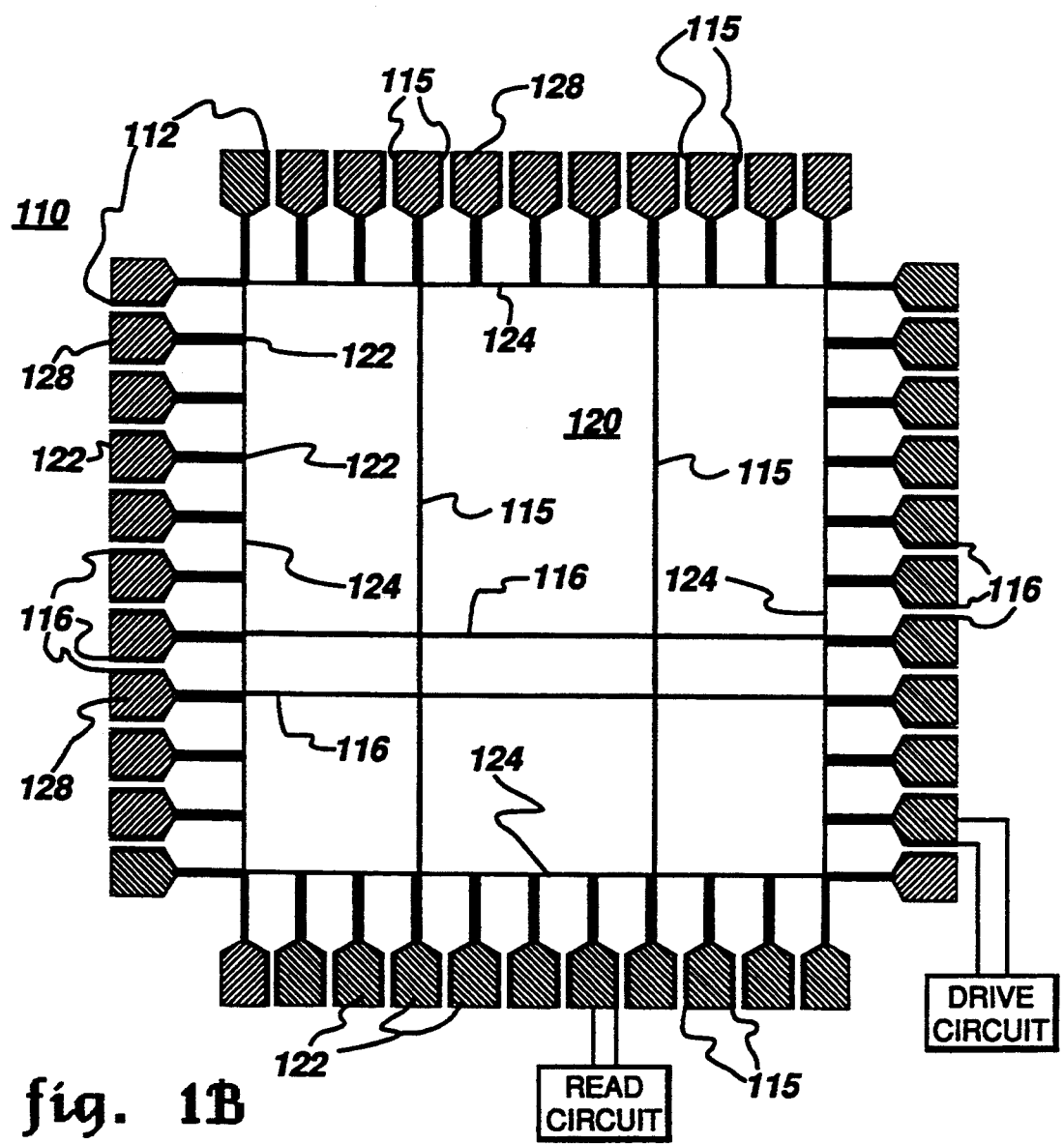
FIG. 1(B) is a plan view of a photosensor array having a common electrode with a plurality of electrical contact pads along its edges in accordance with this invention.

Imager assembly is an x-y-addressed imager, that is the plurality of address lines for addressing individual pixels (not shown) in photosensor array 110 comprises a plurality of data lines 115 (FIG. 1(B)), each of which is oriented substantially along a first axis of imager assembly 100, and a plurality of scan lines 116, each of which is oriented substantially along a second axis of imager assembly 100, the first and second axes being disposed substantially perpendicular to one another. For ease of illustration in FIG. 1(B), only a few of data lines 115 and scan lines 116 are shown extending across array 110, although each set of such address lines would typically extend across the array. Scan and data lines are arranged in rows and columns so that any one pixel in photosensor array 110 is addressable by one scan line and one data line. Address lines 112 comprise a conductive material, such as molybdenum, aluminum, or the like.

Photodiodes 114 are electrically coupled to address lines 112 via TFTs (not shown). Only a portion of each photodiode 114 is illustrated in the particular cross section of FIG. 1(A); photodiodes 114 comprise the active portion of the array, that is, the portion of the array that is responsive to incident photons and that produces the electric signals corresponding to the detected incident radiation. Each photodiode typically comprises a layer of intrinsic amorphous silicon disposed between a layer of silicon doped to exhibit p type conductivity and a layer of silicon doped to exhibit n type conductivity.

A dielectric layer 117 is disposed over address lines 112 and other components (such as TFTs) and photodiodes 114 excepting a contact area on the upper surface of each photodiode. Dielectric layer 117 comprises an organic dielectric material, such as polyimide or the like, or alternatively an inorganic dielectric material, such as silicon nitride or silicon oxide, or alternatively a combination of organic and inorganic dielectric materials. Common electrode 120 is disposed over dielectric layer 117 and photodiodes 114 so as to be in electrical contact with the upper surface of each photodiode 114. Common electrode 120 typically comprises a transparent conducting oxide such as indium tin oxide or the like.

A representative short circuit condition is illustrated in FIG. 1(A). The short circuit condition results from, for example, a defect 119 in dielectric material 114 that comprises an impurity in the dielectric material, such as an electrically conductive material that became entrained with the dielectric material when it was deposited or that is an artifact from the deposition of other components in the array. As illustrated in FIG. 1(A), defect 119 is disposed such that it is electrically coupled to common electrode 120 and to address line 112a such that a conductive path between address line 112a and common electrode 120 exists. Such a conductive path is undesired as it shorts the two conductive layers together, degrading the signal generated by the pixels coupled to that address line. Until such time as the short to the affected address line 112a is isolated, operation of the whole photosensor array is degraded.

Location of the site of the short circuit is necessary to repair photosensor array 110, such as by removing a portion of common electrode 120 to electrically isolate the defect, as is described in the copending application entitled "Method of Isolating Vertical Shorts in an Electronic Array", Serial No. 08/115,082, filed Sep. 2, 1993, which is assigned to the assignee of the present application and incorporated herein by reference. Typically the particular address line that is shorted is readily determined by measuring the resistance between each address line and the common electrode. Locating the particular site of the short circuit along the length of the shorted address line, however, has been time consuming, typically requiring an extensive visual inspection of the entire length of the address line.

In accordance with this invention, common electrode 120 comprises a plurality of electrical contacts 122 that are disposed at selected intervals along the length of edges 124 of the common electrode as shown in FIG. 1(B). The plurality of electrical contacts comprises more than two electrical contacts 122 along each edge 124, that is, the plurality of electrical contacts are disposed along the length of the edge of common electrode 120 and not just at the corner edges of the electrode. Typically, electrical contacts 124 are disposed at equal intervals along one edge 122 of the common electrode, that is, adjacent electrical contacts 122 are equidistant from one another. For purposes of this invention, the equal selected intervals are typically not more than 12% of the length of the edge of the common electrode on which the contact pads are disposed, which, depending on the size of array 110, corresponds to a distance interval between edge electrical contacts 122 in the range between about 0.5 cm and 5 cm. One consideration in determining the length of the selected interval between contact points 122 is that the location generated by the selected relationship (the algorithm set out in detail below) used in the method of localizing the short circuit becomes less accurate as the value of the distance of the short circuit from the common electrode edge approaches the value of the selected interval. As a consequence, it is generally desirable to have a small selected interval to enhance the effectiveness of the method of locating the short circuit. Further, electrical contacts 122 typically are disposed so as to be juxtaposed with connections for address lines 112 (that is, data lines 115 along two opposite edges and scan lines 116 along the other set of opposite edges of array 110) at the edge of imager assembly 100.

In accordance with this invention, electrical contacts 122 are disposed along at least two edges of common electrode 120 in each photosensor array 110, and commonly are disposed along all four edges of the common electrode. An imager assembly 100 comprises at least one photosensor array 110 which in turn advantageously comprises a common electrode having electrical contacts 122 disposed on all four edges of the electrode. In some large area imagers, e.g., having an area greater than about 200 cm$^2$ (such as a 15 cm×15 cm array), multiple photosensor arrays 110 are disposed together to comprise the entire array. In such an arrangement, typically at least two edges of each photosensor array correspond to the lateral boundaries (that is the edges of the entire assembly) of imager assembly 100 and electrical contacts 122 are disposed along the edges of the respective common electrode 120 that correspond to the lateral dimensions of imager assembly 100.

Figure 1C:
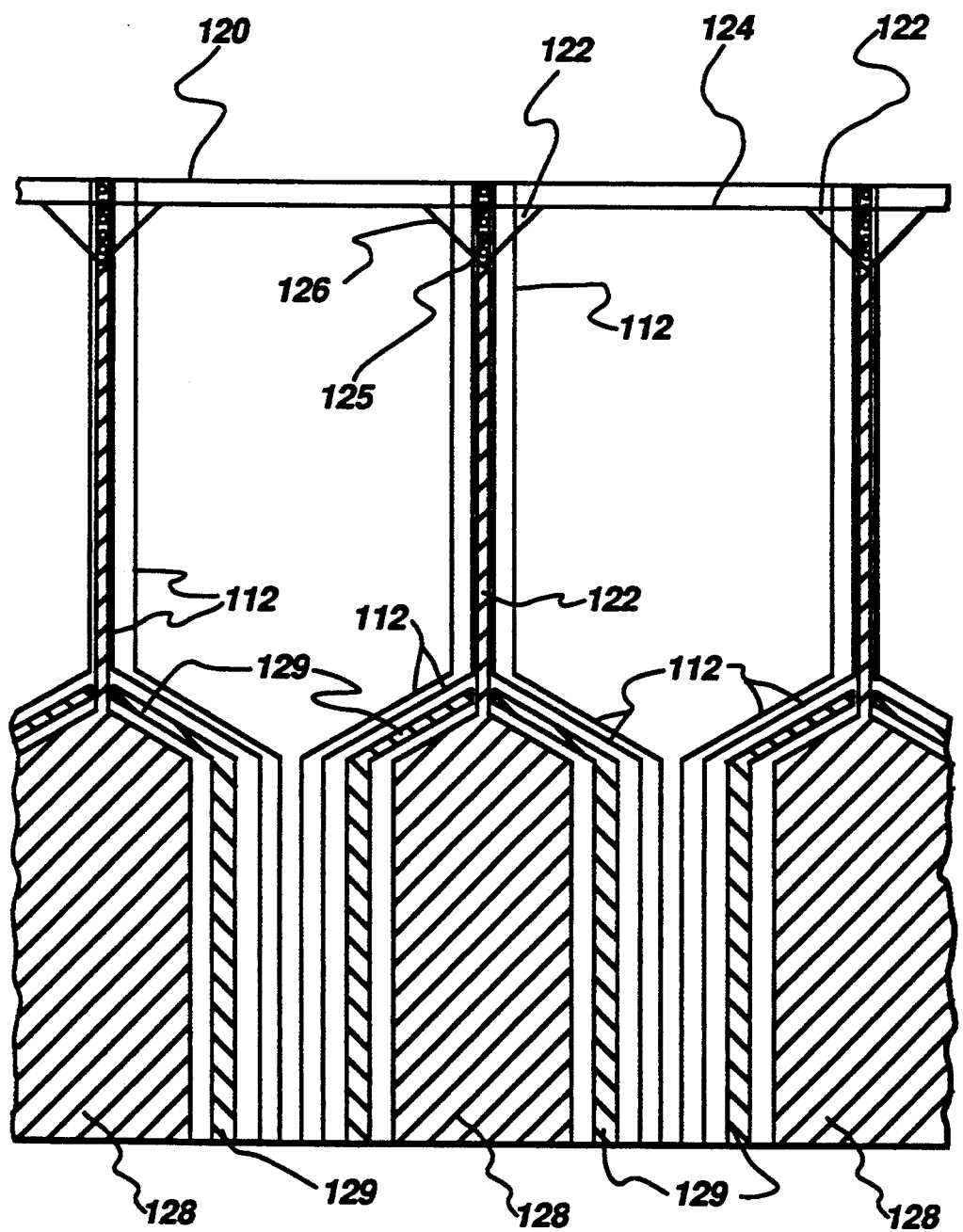
FIG. 1(C) is a detail view of a portion of a photosensor array having common electrode edge contact pads in accordance with this invention.

A detail view of an electrical contact 122 is illustrated in FIG. 1(C). A portion of common electrode 120 and electrode edge 124 appear at the top of that figure. Electrical contact 122 comprises a protrusion of electrically conductive material that extends from edge 124 of the common electrode and is disposed so as to facilitate an electrical connection to that portion of common electrode 120. Specifically, electrical contact 122 comprises an extension 126 from the main body of common electrode 120 and a contact pad 128 to which extension 126 is electrically coupled. Extension 126 comprises the same conductive material as common electrode 120 (e.g., indium tin oxide) such that extension 126 is readily formed in the deposition and patterning processes for formation of common electrode 120. Extensions 126 are further typically disposed at a point in photosensor array 110 at which address lines 112 extend from the array (for purposes of electrical contact to components off of the wafer). Contact pad 128 comprises a conductive material such as molybdenum, chromium, or the like, or alternatively, multiple layers of conductive material, such as indium tin oxide over molybdenum.

As illustrated in FIG. 1(C), in most imager assemblies address lines 112 are arranged in a pattern in which address lines extending from the array are disposed relatively close together so that the lines are readily coupled to off-the-wafer readout circuits. Contact pad 128 typically is disposed so as to be electrically insulated from address lines 112 at the edge of the wafer. Electrical coupling between extension 126 and contact pad 128 is typically through vias 125 (as the metal comprising contact pad 128 and the transparent conducting oxide comprising extension 126 are typically disposed at different vertical levels in imager assembly in accordance with normal fabrication techniques). Guard contacts 129 are also typically disposed on the edge of the wafer between the common electrode and address line contacts. Guard contacts 129 typically are biased at a voltage similar (e.g., within about 1 Volt) of the voltage of the address line extending from the respective edge of the array on which guard contacts 129 are disposed so as to provide a voltage sink to prevent leakage between address lines 112 and common electrode contact points 122. That is, leakage from address lines 112 or the common electrode contacts 122 is drawn away by guard contact 129 and does not leak to either the common electrode or address line. Alternatively, the guard contacts are biased with a voltage similar to the bias on the data line (since leakage to data lines presents the greatest potential for introduction of noise into the imager output).

In operation, the charge generated in respective photodiodes in pixels of the imager array are periodically read out by coupling the photodiode, via its respective TFT and a data line, to readout electronics. The amount of charge removed from the photodiode corresponds to the photons absorbed by that photodiode during the integration cycle between readouts; the photodiode is returned to a known bias condition prior t,o the start of the next integration cycle. Measurement of the charge from the photodiode involves current passage from readout electronics amplifiers along the data line to the photodiode and back to the amplifier via the common electrode. Thus, the impedance and magnetic loop area of the common electrode can have a significant effect on the operation of the imager.

In accordance with this invention, common electrode electrical contacts 122 disposed along selected edges of imager assembly 100 as described above provide numerous points at which electrical contact can be made to the common electrode along the length of the imager assembly's edge. This configuration is advantageous because it provides low impedance contacts to the common electrode. For example, contact between array readout and drive circuits (representative ones of which are illustrated in FIG. 1(B)) can be made at one or more of numerous electrical contacts 122 along the edge of the electrode providing for more and shorter current paths between a pixel being readout and the readout circuits. Thus, typically each readout and drive circuit is coupled to at least one of the respective address lines in the imager assembly and is further coupled to the common electrode at at least one selected common electrode electrical contact point, the selected contact point being disposed substantially in the vicinity of (e.g., nearest to) the address lines to which that readout and drive circuit is coupled.

The impedance seen by the readout circuits coupled to common electrode electrical contacts disposed in proximity to the pixels being readout is low as compared to a device having just common electrode contacts on the corner of the array (e.g., in a typical large area array, about a twenty-fold decrease in impedance is seen by using the multiple common electrode electrical contacts 122 of the present invention compared with the conventional common electrode structure). Additionally, such a common electrode configuration is also beneficial in that the presence of electrical contact points 122 disposed along the edge of the wafer provide ready connection points for off-the-wafer readout and drive circuits that are adapted to be electrically coupled to both the common electrode and respective address lines.

Further, common electrode 120 having electrical contacts 122 disposed along selected edges is configured to readily use the method of locating a short circuit as described in greater detail below.

Figure 2A:
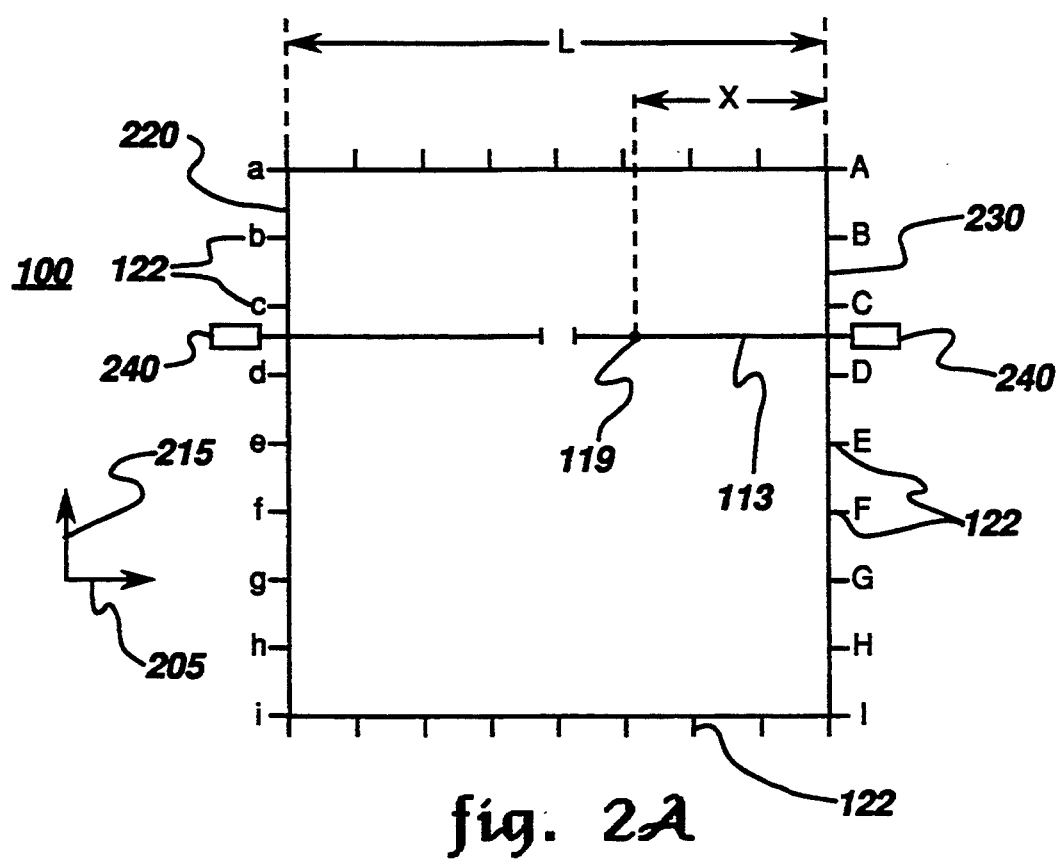
FIG. 2(A) illustrates a photosensor array addressable from opposite sides and having a common electrode short that is locatable in accordance with this invention.

A short circuit in an imager assembly 100 comprising a common electrode having electrical contacts 122 as described above is readily localized in accordance with the method described in copending application Ser. No. 08/161,037 filed concurrently herewith. For example, a short circuit is located in an imager assembly having common electrode electrical contacts 122 on opposite sides of the imager assembly, as illustrated in FIG. 2(A), in the following manner. Shorted address line 113, which is shorted to the common electrode at short circuit site 119, is determined in accordance with known procedures, such as measuring the resistance between individual address lines and the common electrode. For purposes of illustration and not limitation, shorted address line 113 illustrated in FIG. 2(A) is disposed along a first axis 205 of imager assembly 100; a second axis 215 of imager assembly is oriented substantially perpendicular to first axis 205. The two axes correspond to the orientation in imager assembly 100 of the rows and columns of address lines, e.g., scan and data lines. Further, shorted address line 113 is illustrated as having a break in the middle of the array, as is sometimes done for noise reduction purposes in large area imagers that are driveable from all four sides of the array so as to reduce the total capacitance of the data line. This method is equally applicable to imager assemblies in which address lines are not intentionally opened.

A test voltage is applied to shorted address line 113; typically the remaining address lines are unbiased so that they are electrically floating during this procedure. The test voltage has an absolute value that is typically in the range of about 1 V to 10 V, and is applied by a voltage source 240 electrically coupled to shorted address line 113. Currents are then measured, using standard current-measuring techniques and equipment, at electrical contacts 122 that are disposed along a first edge 220 of common electrode 120 and along a second edge 230 of common electrode 120. First and second edge 220, 230, are each oriented along second axis 215, that is, they are disposed perpendicular to shorted address line 113. Electrical contacts 122 from which current measurements are taken, that is contacts 122 disposed along first and second edge 220, 230, respectively, are grounded. Contacts 122 disposed along edges of the common electrode 120 that are oriented parallel to the shorted address line are "floating" (i.e., unbiased, or no voltage applied). The current measured at each respective electrical contact 122 along first edge 220 (e.g., $I_a + I_b + \ldots I_i$ as illustrated in FIG. 2(A)) is summed, and the current measured from each electrical contact along second edge 230 is also summed ($I_A + I_B + \ldots I_I$ as illustrated in FIG. 2(A)). The measured currents are then processed in accordance with the following selected relationship to determine the short circuit location, expressed as a distance "X" along shorted address line 113:

$$I_{A-N}/I_{a-n} = (L-X)/X$$

wherein:

$I_{A-N}$ represents the sum of measured currents from common electrode contact points along common electrode second edge 230;

$I_{a-n}$ represents the sum of measured currents from common electrode contact points along common electrode first edge 220;

L represents the length of the shorted address line; and

X represents the point of the short circuit as distance from the common electrode first opposite edge.

As is illustrated in FIG. 2(A), determination of the distance "X" enables one to localize the short circuit along the shorted address line, thereby reducing the time that is necessary to find and repair the defect. Further, as used herein, the step of processing the respective measured currents typically includes the steps of applying (that is, electrically coupling) the measured currents to the input of a processor device (such as a computer or other set of electronic components) programmed to manipulate said measured currents in accordance with the selected relationship. Alternatively, an operator can manually perform the mathematical functions of the selected relationship to the measured current data.

Figure 2B:
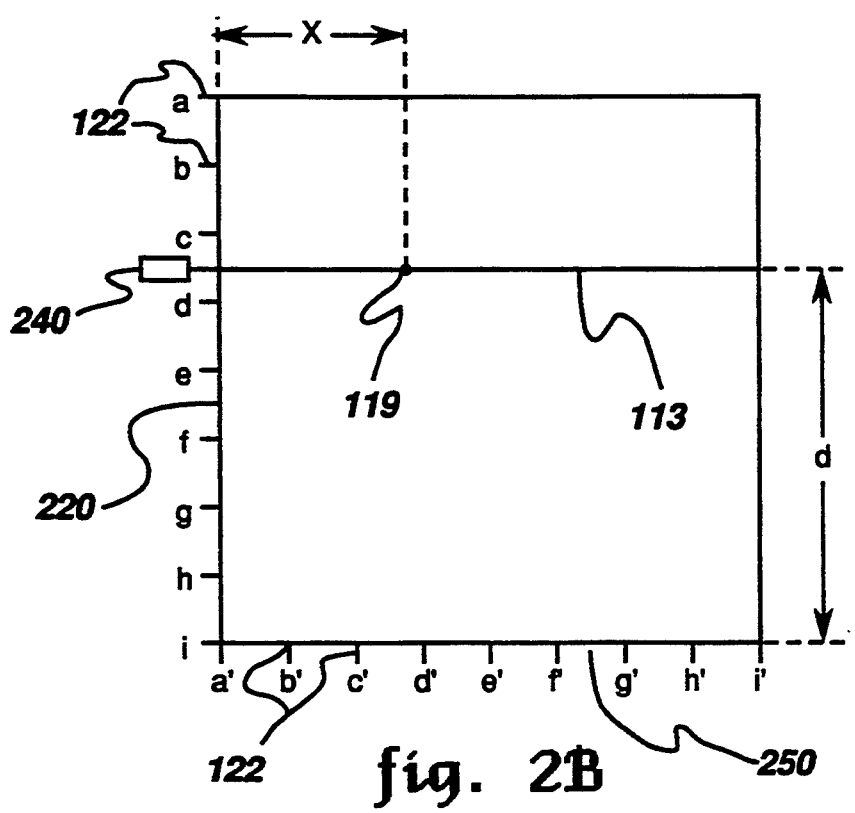
FIG. 2(B) illustrates a photosensor array addressable from adjoining sides and having a common electrode short that is locatable in accordance with this invention.

An imager assembly 100 having a photosensor array 110 that is not addressable from opposite sides, such a photosensor array that forms one portion of a larger array, is illustrated in FIG. 2(B). Photosensor array 110 comprises electrical contacts 120 disposed along adjoining (or adjacent) edges of one array, that is edges of photosensor array that correspond to the lateral boundaries (or sides) of imager assembly 100. A test voltage is applied to shored address line 113. The test voltage typically has an absolute value in the range of about 1 V to 10 V, and is applied by a voltage source 240 electrically coupled to shorted address line 113. Currents are then measured, using standard current-measuring techniques and equipment, at electrical contacts 122 that are disposed along a first edge 220 of common electrode 120 and along a second edge 250 of common electrode 120. Electrical contacts 122 from which current measurements are taken, that is contacts 122 disposed along first edge 220 and second edge 250, are grounded (or held at a common potential). The other edges of the common electrode are "floating" (i.e., unbiased or no voltage applied). First edge 220 is oriented along second axis 215 (that is perpendicular to shorted address line 113 as illustrated in FIG. 2(B)) and adjoins second edge 250, which is oriented along first axis 205 (that is parallel to shorted address line 113 as illustrated in FIG. 2(B)). The current measured at each respective electrical contact 122 along first edge 220 (e.g., $I_a + I_b + \ldots I_i$ as illustrated in FIG. 2(B)) is summed as is current measure from each electrical contact along second edge 250 ($I_{a'} + I_{b'} + \ldots I_{i'}$ as illustrated in FIG. 2(B)). The measured currents are then processed in accordance with the following selected relationship to determine the short circuit location, expressed as a distance "X" along shored address line 113:

$$X = [\tan((\pi/2)(I_{parallel\ edge}/(I_{parallel\ edge} + I_{perpendicular\ edge})))][d]$$

wherein:

X is the distance of the short along the shored address line from the adjoining common electrode edge;

$I_{parallel\ edge}$ is the sum of currents from common electrode electrical contacts 122 along the adjoining common electrode edge that is substantially oriented parallel to the shorted address line, that is, second edge 250 as illustrated in FIG. 2(B);

$I_{perpendicular\ edge}$ is the sum of currents from common electrode electrical contacts 122 along the common electrode edge that is substantially oriented perpendicular to the shorted address line, that is, first edge 220 as illustrated in FIG. 2(B); and d is the distance of the shorted address line 113 from the adjoining common electrode edge 250 that is oriented parallel to the shorted address line and from which $I_{parallel\ edge}$ is measured.

As noted above with respect to the description of the embodiment illustrated in FIG. 2(A), determination of the distance "X" typically includes the steps of applying the measured current data to a processing device programmed with the selected relationship, or alternatively manually performing the functions of the selected relationship. Determination of distance "X" enables one to localize the short circuit along the shorted address line, thereby reducing the time that is necessary to find and repair the defect.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An x-y-addressed solid state radiation imager assembly having at least one photosensor array, each photosensor array comprising:

a plurality of address lines, said plurality of address lines further comprising a plurality of scan lines and a plurality of data lines, said plurality of scan lines each being oriented substantially along a first axis of said imager and said plurality of data lines each being oriented substantially along a second axis of said imager assembly; and a common electrode disposed over said photosensor array so as to be electrically insulated from said address lines, said common electrode extending substantially over the area of said photosensor array and having at least one edge corresponding to a lateral boundary of said imager assembly;

said at least one edge of said common electrode further comprising more than two electrical contact points disposed at selected intervals along the length of said edge.

2. The imager assembly of claim 1 wherein said electrical contact points are disposed at equal intervals along the length of said edge.

3. The imager assembly of claim 2 wherein said imager assembly comprises a single photosensor array and each edge of said common electrode comprises said electrical contact points.

4. The imager assembly of claim 2 wherein said imager assembly comprises a plurality of photosensor arrays, each common electrode edge corresponding to a lateral boundary of said imager assembly comprising said electrical contact points.

5. The imager assembly of claim 2 wherein said selected interval not greater than about 12% of the length of said selected edge of said common electrode.

6. The imager assembly of claim 2 wherein said selected interval is in the range between 0.5 cm and 5 cm.

7. The imager assembly of claim 1 wherein said common electrode comprises a transparent conducting oxide material.

8. The imager assembly of claim 7 wherein said transparent conducting oxide comprises indium tin oxide.

9. The imager assembly of claim 1 wherein each of said electrical contact points comprises an extension of conductive material extending beyond the lateral limits of the active region of said photosensor array.

10. The imager assembly of claim 9 wherein said electrical contact point further comprises an electrical contact pad, said electrical contact pad being electrically coupled to said extension of conductive material extending beyond the lateral limits of the active region of the array.

11. The imager assembly of claim 10 wherein said electrical contact pad comprises a material selected from the group consisting of molybdenum and chromium.

12. The imager assembly of claim 11 wherein said electrical contact pad comprises multiple layers of conductive material, one of said layers comprising indium tin oxide.

13. The imager assembly of claim 1 further comprising a plurality of respective array readout and drive circuits, each of said readout and drive circuits being coupled to respective ones of said address lines in said imager assembly and further being coupled to said common electrode at at least a selected one of said common electrode electrical contact points, said selected one of said contact points being disposed substantially in the vicinity of the respective one of said address lines to which the respective readout and drive circuit is coupled.

* * * * *